United States Patent
Lee

(10) Patent No.: US 7,978,010 B2
(45) Date of Patent: Jul. 12, 2011

(54) BOOST OPERATIONAL AMPLIFIER

(75) Inventor: Won-Hyo Lee, Seodaemun-gu (KR)

(73) Assignee: Dongbu HiTek Co., Ltd., Seoul (KR)

(*) Notice: Subject to any disclaimer, the term of this patent is extended or adjusted under 35 U.S.C. 154(b) by 18 days.

(21) Appl. No.: 12/640,993

(22) Filed: Dec. 17, 2009

(65) Prior Publication Data
US 2010/0164626 A1    Jul. 1, 2010

(30) Foreign Application Priority Data
Dec. 29, 2008 (KR) .................. 10-2008-0135851

(51) Int. Cl.
*H03F 3/45* (2006.01)
(52) U.S. Cl. ....................... 330/255; 330/257
(58) Field of Classification Search .................. 330/255, 330/257
See application file for complete search history.

(56) References Cited

U.S. PATENT DOCUMENTS

| 5,389,894 A | * | 2/1995 | Ryat ............................. 330/255 |
| 5,491,437 A | * | 2/1996 | Rincon et al. ................. 327/108 |
| 5,990,742 A | * | 11/1999 | Suzuki .......................... 330/253 |

* cited by examiner

*Primary Examiner* — Steven J Mottola
(74) *Attorney, Agent, or Firm* — Sherr & Vaughn, PLLC

(57) ABSTRACT

A boost operational amplifier. A boot operational amplifier may include a differential amplifying unit amplifying and/or outputting an inputted differential voltage, a first mirroring unit mirroring a current flowing through a first output terminal of a differential amplifying unit, which may output a mirrored first mirror current, a second mirroring unit mirroring a current flowing through a second output terminal of a differential amplifying unit, which may output a mirrored second mirror current, a pull-up transistor connected between a first power source and an output node, which may switch based on a first and/or a second mirror current, and/or a pull-down transistor connected between a second power source and an output node, which may switch based on a first and/or a second mirror current.

9 Claims, 3 Drawing Sheets

BOOST OPERATIONAL AMPLIFIER

The present application claims priority under 35 U.S.C. 119 to Korean Patent Application No. 10-2008-0135851 (filed on Dec. 29, 2008) which is hereby incorporated by reference in its entirety.

BACKGROUND

Embodiments relate to an amplifier. Some embodiments relate to a boost operational amplifier.

Figure 1:
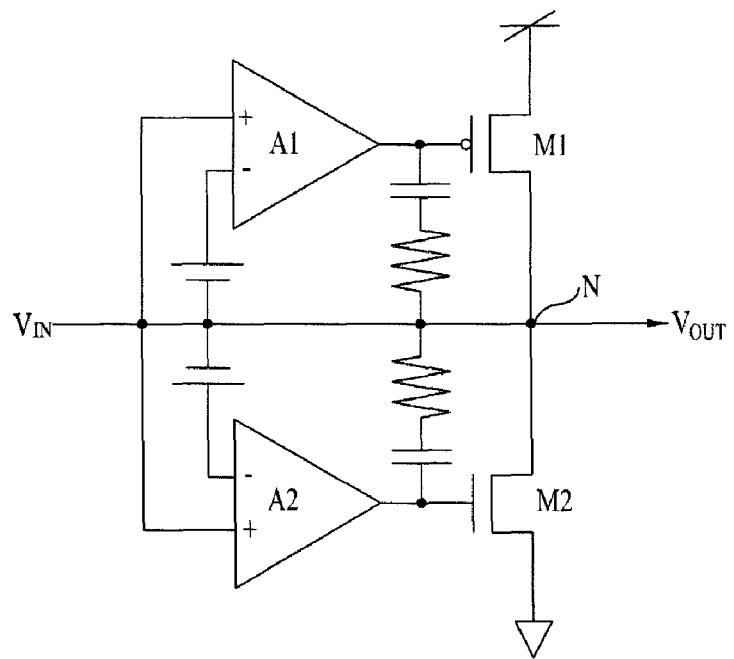
Figure 2:
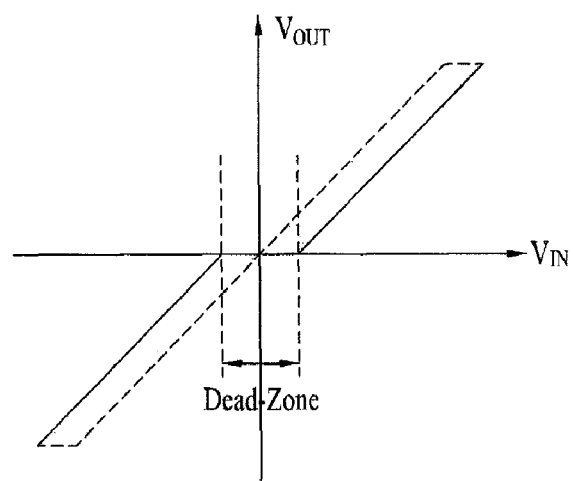

A boost operational amplifier may be used to drive a large-scale resistance and/or a capacitive load. Example FIG. 1 is a configurational diagram of a boost operational amplifier, and FIG. 2 is a diagram of a dead zone of a boost operational amplifier illustrated in FIG. 1. Referring to FIG. 1 and FIG. 2, in order to reduce a ripple to instant load switch, a stabilizing capacitor, for example between approximately 1 nF and 100 uF, may be connected to output node N of a boost operational amplifier to use. A boost operational amplifier may have a relatively large size of an output transistor to drive a sufficient output current using a simple configuration. Since a size of an output transistor may be considerably large, a dead zone, for example as shown in FIG. 2, may be provided to at least one side to reduce a standby current.

An output of a boost operational amplifier may form a dead zone, and/or a boost operational amplifier may be normally driven in a course of pull-up and/or pull-down of a boost operational amplifier, but may not be driven during a dead zone interval. Therefore, stability may be substantially maintained in a relatively heavily loaded state and/or current consumption may be minimized. However, since two inputs may be provided to an operational amplifier, offsets mutually generated from two inputs may vary. Therefore, a characteristic of a dead zone may not appear precisely in a controlled region.

Figure 3A:
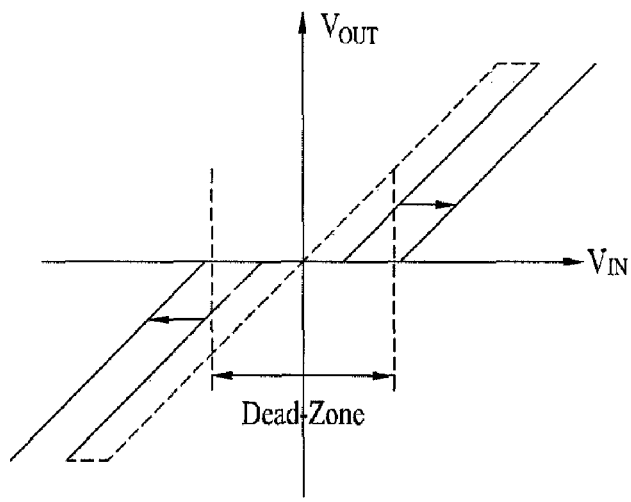
Figure 3B:
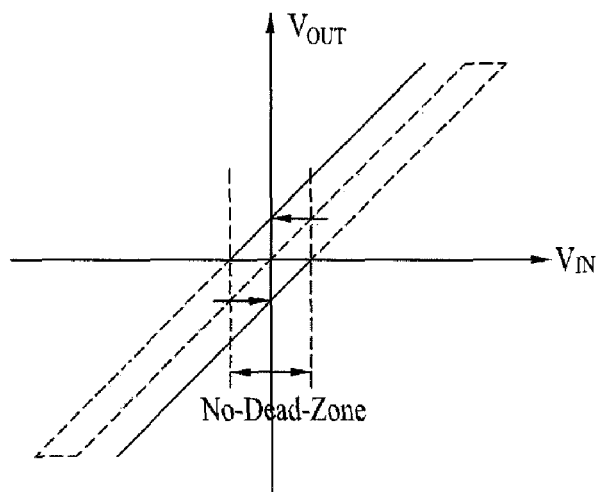

Referring to example FIG. 3A, a graph illustrates extension of a dead zone due to an offset difference. Referring to FIG. 3B, a graph illustrated a negative dead zone due to an offset difference. First operational amplifier A1 may have a positive offset and/or second operational amplifier A2 may have a negative offset, such that a DC level and/or a dead zone may relatively increase, for example as illustrated in FIG. 3A. A first operational amplifier A1 may have a negative offset and/or a second operational amplifier A2 may have a positive offset, such that two transistors M1 and/or M2 to output drive may be simultaneously turned on. Therefore, a short current may be generated.

If offsets of first and second operational amplifiers A1 and A2, respectively, are randomly changed, a size and/or position of a dead zone may have variations. Hence, these variations may need to be compensated. If a size of a dead zone becomes considerably small and/or disappears, a large ripple may be generated while a load may be switched. Thus, an externally connected capacitor may be repeatedly charged and/or discharged to increase current consumption. Moreover, if a size of a dead zone relatively increases, a size of a valid offset relatively increases to minimize performance of an operational amplifier.

Accordingly, there is a need of an amplifier, which may include a boost operational amplifier, and methods thereof, which may minimize an offset and/or a variation for a dead zone.

SUMMARY

Embodiments relate to an amplifier, which may include a boost operational amplifier, and methods thereof. According to embodiments, a boost operational amplifier may be configured to minimize an offset and/or a variation for a dead zone.

According to embodiments, a boost operational amplifier may include a differential amplifying unit amplifying and/or outputting an inputted differential voltage. In embodiments, a boost operational amplifier may include a first mirroring unit mirroring a current flowing through a first output terminal of a differential amplifying unit, and/or outputting a mirrored first mirror current. In embodiments, a boost operational amplifier may include a second mirroring unit mirroring a current flowing through a second output terminal of a differential amplifying unit, and/or outputting a mirrored second mirror current. In embodiments, a boost operational amplifier may include a pull-up transistor connected between a first power source and an output node. In embodiments, pull-up transistor switching may be based on first and/or second mirror currents. In embodiments, a boost operational amplifier may include a pull-down transistor connected between a second power source and an output node. In embodiments, a pull-down transistor switching may be based on a first and/or second mirror current.

According to embodiments, a boost operational amplifier may include a current source. In embodiments, a current source may be connected between an output node and a second power source. In embodiments, a boost operational amplifier may include a resistor and/or a capacitor. In embodiments, a resistor and a capacitor may be connected in series between a gate of a pull-up transistor and an output node.

According to embodiments, a first mirroring unit may include a first current mirror connected between a first power source and a first output terminal, and/or between a first power source and a gate of a pull-up transistor to mirror a current flowing between a first power source and a first output terminal. In embodiments, a first current mirror may provide a mirrored current to a gate of a pull-up transistor. In embodiments, a second current mirror may be connected between a first power source and a first output terminal, and/or between a first power source and a gate of a pull-down transistor to mirror a current flowing between a first power source and a first output terminal. In embodiments, a second current mirror may provide a mirrored current to a gate of a pull-down transistor.

According to embodiments, a second mirroring unit may include a third current mirror connected between a first power source and a second output terminal, and/or between a second power source and a gate of a pull-up transistor to mirror a current flowing between a first power source and a second output terminal. In embodiments, a second current mirror may provide a mirrored current to a gate of a pull-up transistor. In embodiments, a fourth current mirror may be connected between a first power source and a second output terminal, and/or between a second power source and a gate of a pull-down transistor to mirror a current flowing between a first power source and a second output terminal. In embodiments, a fourth current mirror may provide a mirrored current to a gate of a pull-down transistor.

According to embodiments, a boost operational amplifier may minimize a deviation for a dead zone, minimize a short current, and/or enables a relatively stable drive.

DRAWINGS

Example FIG. 1 is a diagram of a boost operational amplifier.

Example FIG. 2 is a diagram of a dead zone of a boost operational amplifier illustrated in FIG. 1.

Example FIG. 3A is a graph of extension of a dead zone due to an offset difference.

Example FIG. 3B is a graph of a negative dead zone due to an offset difference.

Figure 4:
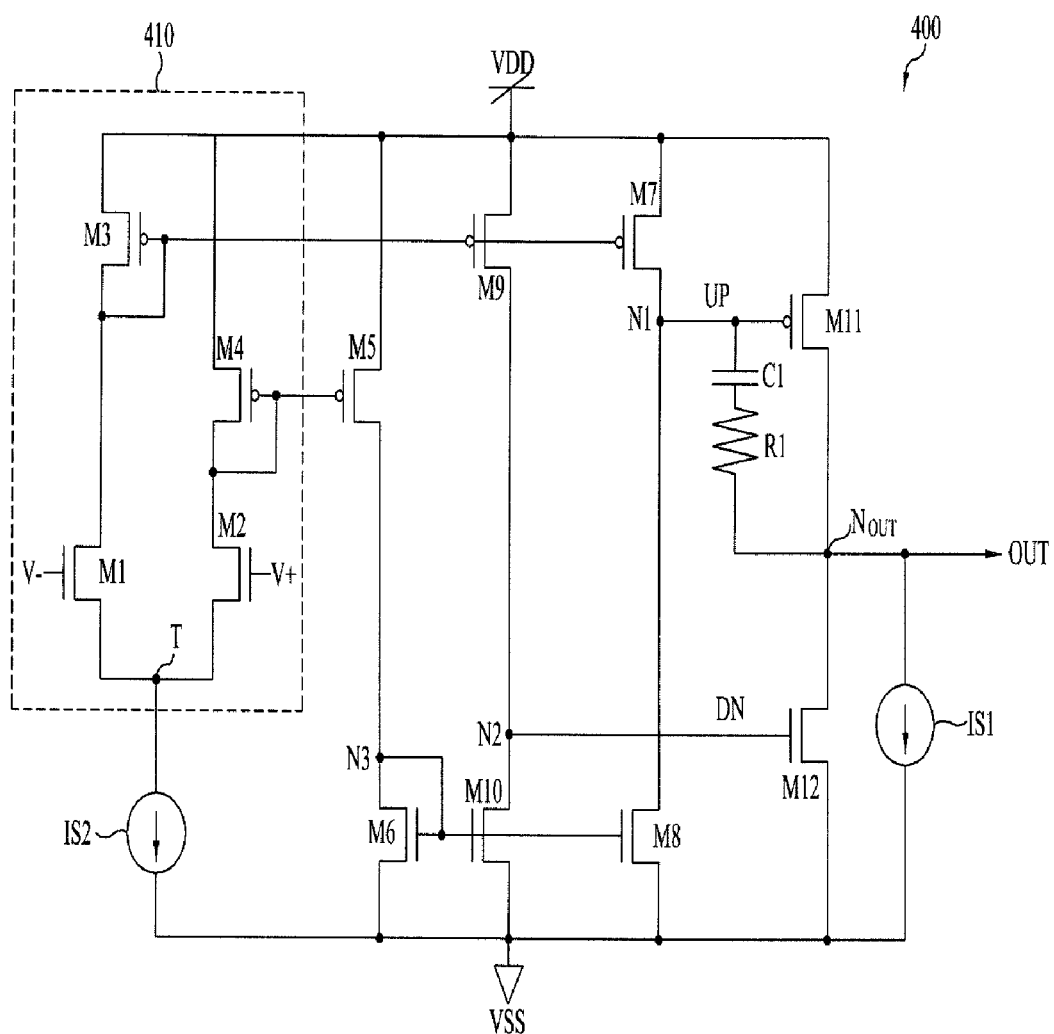

Example FIG. 4 is a diagram of a boost operational amplifier in accordance with embodiments.

DESCRIPTION

Embodiments relate to an amplifier, which may include a boost operational amplifier, and methods thereof. Referring to example FIG. 4, a diagram of a boost operational amplifier in accordance with embodiments is illustrated. According to embodiments, boost operational amplifier 400 may include differential amplifying unit 410, first mirroring unit M3, M9 and/or M7, second mirroring unit M4, M5, M6, M10 and/or M8, pull-up transistor M11, pull-down transistor M12, capacitor C1, resistor R1 and/or first current source IS1.

According to embodiments, differential amplifying unit 410 may amplify and/or output inputted differential voltages V+ and/or V−. In embodiments, differential amplifying unit 410 may include a pair of differential input transistors M1 and M2, and/or second current source IS2. In embodiments, differential voltage may reference a difference between first voltage V− and second voltage V+. In embodiments, a pair of differential input transistors M1 and M2 may include first differential input transistor M1 having first voltage V− inputted thereto and/or second differential input transistor M2 having second voltage V+ inputted thereto. In embodiments, second current source IS2 may be connected between each tale T of differential input transistors M1 and M2, and/or a second power source VSS.

According to embodiments, first mirroring unit M3, M9 and/or M7 may mirror a current flowing in a first output terminal of differential amplifying unit 410, and/or may supply a mirrored current to first node N1 and/or second node N2. In embodiments, second mirroring unit may mirror a current flowing in a second output terminal of differential amplifying unit 410, and/or may supply a mirrored current to each of first node N1 and second node N2. In embodiments, first output terminal may be a drain of M1 and/or second output terminal may be a drain of M2. In embodiments, current flowing through a first output terminal may be current flowing between a source and drain of M3 and/or current flowing through a second output terminal may be current flowing between a source and drain of M4.

According to embodiments, first mirroring unit M3, M7 and/or M9 may include first current mirrors M3 and M7, and/or second current mirrors M3 and M9. In embodiments, first mirroring unit M3, M7 and/or M9 may include first transistor M3, second transistor M7 and/or third transistor M9. In embodiments, first transistor M3 may be connected between first power source VDD and a first output terminal, and its gate and drain may be connected to each other. In embodiments, second transistor M7 may be connected between first power source VDD and first node N1, and may have a gate connected to a gate of first transistor M3. In embodiments, third transistor M9 may be connected between first power source VDD and second node N2, and/or may have a gate connected to a gate of first transistor M3.

According to embodiments, second mirroring unit M4, M5, M6, M10 and/or M8 may primarily mirror a current flowing through second output terminal of differential amplifying unit 410 to third node N3, and/or may secondarily mirror a primarily mirrored current to supply to second node N2 and/or first node N1. In embodiments, second mirroring unit M4, M5, M6, M10 and/or M8 may include 4$^{th}$ transistor M4, 5$^{th}$ transistor M5, 6$^{th}$ transistor M6, 7$^{th}$ transistor M10 and/or 8$^{th}$ transistor M8. In embodiments, 4$^{th}$ transistor M4 may be connected between first power source VDD and second output terminal, and/or its gate and drain may be connected to each other. In embodiments, 5$^{th}$ transistor M5 may be connected between first power source VDD and third node N3, and/or may have a gate connected to a gate of 4$^{th}$ transistor M4.

According to embodiments, 6$^{th}$ transistor M6 may be connected between third node N3 and second power source VSS, and/or its gate and drain may be connected. In embodiments, 7$^{th}$ transistor M10 may be connected between second node N2 and second power source VSS, and/or may have a gate connected to a gate of 6$^{th}$ transistor M6. In embodiments, 8$^{th}$ transistor M8 may be connected between first node N1 and second power source VSS, and/or may have a gate connected to a gate of 6$^{th}$ transistor M6.

According to embodiments, pull-up transistor M11 may be connected between first power source VDD and output node NOUT, and/or may have a gate connected to first node N1. In embodiments, pull-up transistor M11 may perform switching based on a voltage at first node N1. In embodiments, pull-down transistor M12 may be connected between second power source VSS and output node NOUT, and/or may have a gate connected to second node N2. In embodiments, pull-up transistor M12 may perform switching based on a voltage at second node N2. In embodiments, first current source IS1 may be connected between output node NOUT and second power source VSS. In embodiments, capacitor C1 and resistor R1 may be connected, for example in series, between first node N1 and output node NOUT.

According to embodiments, 1$^{st}$ to 5$^{th}$ transistors M3 to M5, M7 and/or M9 may be PMOS transistor and/or 6$^{th}$ to 8$^{th}$ transistors M6, M10 and/or M8 may be NMOS transistors. In embodiments, first node N1 may be an access point to which a drain of 2$^{nd}$ transistor M7, a drain of 8$^{th}$ transistor M8 and/or a gate of pull-up transistor M11 may be connected. In embodiments, second node N2 may be an access point to which a drain of 3$^{rd}$ transistor M9 and/or a drain of 7$^{th}$ transistor M10 may be connected. In embodiments, third node N3 may be an access point to which a drain of 5$^{th}$ transistor M5 and/or a drain and/or gate of 6$^{th}$ transistor M6 may be connected. In embodiments, pull-up transistor M11 may include a PMOS transistor and/or pull-down transistor M12 may include an NMOS transistor.

Embodiments relate to methods of a boost operational amplifier. In embodiments, a W/L ratio of transistors included in boost operational amplifier 400 may relate to $(W/L)_{M3}/(W/L)_{M7}=(W/L)_{M4}/(W/L)_{M5}$, $(W/L)_{M6}=(W/L)_{M8}$, where W and L may reference a width and a length of a transistor, respectively. In embodiments, if a DC voltage is applied to input differential amplifying unit 410 of boost operational amplifier 400, output voltage OUT having substantially the same DC level of an input voltage may be generated by pull-up drive control unit 420, pull-up output transistor M11 and/or first current source IS1.

According to embodiments, an example design may include $(W/L)_{M3}/(W/L)_{M9}<1$, $(W/L)_{M6}/(W/L)_{M10}>1$, and/or second node N2 may become substantially equal to second poser source VSS to turn off pull-down output transistor M12, thereby not substantially affecting an output. In embodiments, a current path of an output of boost operational amplifier 400 may include pull-up output transistor M11 and/or first current source IS1 only. In embodiments, a relatively large load may connected to an output of boost operational amplifier 400, and/or output voltage OUT may substantially instantly be relatively lowered. In embodiments, a ripple may be generated from an output. In embodiments, a level of first node N1 may go to low, which may pull up a voltage and/or output voltage OUT may rise to a relatively normal target DC level.

According to embodiment, for example in load switching to connect a load, overshoot may be generated. In embodiments, overshoot may be relatively quickly pulled down. In embodiments, for example when overshoot may exceed a preset target level, a current of $6^{th}$ transistor may abruptly relatively decrease, whereby a current of $7^{th}$ transistor M10 may relatively decrease as well. In embodiments, a relative current decrease of $7^{th}$ transistor M10 may cause a relative voltage increase of second node N2 to turn on pull-down output transistor M12. In embodiments, a relatively large overshoot may be relatively quickly stabilized. In embodiments, for example if overshoot voltage may be relatively quickly lowered to enter a dead zone, pull-down output transistor M12 may be turned off again to substantially not affect circuitry. In embodiments, a pull-down function may be performed by first current source IS1. In embodiments, pull-down and/or under-shoot may substantially not be generated to substantially prevent pull-up circuit from operating in a relatively large scale. In embodiments, ripple may be minimized.

According to embodiments, one operational amplifier 410 may be used without substantially separating inputs. In embodiments, it may be able to minimize a deviation of a dead zone smaller than that of a boost circuit implemented with two independent operational amplifiers. In embodiments, for example where $(W/L)_{M3}/(W/L)_{M7}>1$ and $(W/L)_{M9}/(W/L)_{M11}<1$, when a ratio may be adjusted to $(W/L)_{M3}/(W/L)_{M6}=(W/L)_{M9}/(W/L)_{M10}=1$, it may be able to implement a boost operational amplifier having a dead zone characteristic opposite than described above in accordance with embodiments.

In a small-scale DDI, a supply power may be internally generated and/or used. A current consumption may become relatively considerably large, such that a problem may be caused. In embodiments, if boost operational amplifier 400 is used, it may be able to relatively considerably reduce power consumption due to a dead zone variation. In embodiments, as a deviation of an operational amplifier becomes relatively small, it may be able to drive a precise level. In embodiments, an image quality and/or yield may be maximized.

A shunt regulator, which may provide a virtual ground of a drive line, may include a relatively big current flow in +/− direction. A dead zone may be formed in an output driver to minimize a standby current. A dead zone may have a relatively considerably low level of several mV and/or a handled current of several amperes. A size of a driver may be relatively considerably large. A short current may be generated by dead zone overlapping, such that a relatively big short may be generated. An offset deviation of an output driver may relatively increase, and/or variation of a virtual ground may be generated. A relatively stable level detection may become difficult. In embodiments, if a boost OP in accordance with embodiments may be applied to an output driver, it may be able to drive a precise DC level with a relatively small offset deviation.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
 a differential amplifying unit configured to amplify and output an inputted differential voltage;
 a first mirroring unit configured to mirror a current flowing through a first output terminal of said differential amplifying unit, said first mirroring unit configured to output a mirrored first mirror current;
 a second mirroring unit configured to mirror a current flowing through a second output terminal of said differential amplifying unit, said second mirroring unit configured to output a mirrored second mirror current;
 a pull-up transistor connected between a first power source and an output node, said pull-up transistor configured to switch based on said first and second mirror currents; and
 a pull-down transistor connected between a second power source and said output node, said pull-down transistor configured to switch based on said first and second mirror currents,
 wherein said first mirroring unit comprises:
 a $1^{st}$ transistor connected between said first power source and said first output terminal including a gate and a drain connected to each other;
 a $2^{nd}$ transistor connected between said first power source and a gate of said pull-up transistor, said $2^{nd}$ transistor including a gate connected to the gate of said $1^{st}$ transistor; and
 a $3^{rd}$ transistor connected between said first power source and a gate of said pull-down transistor, connected to the gate of said $1^{st}$ transistor.

2. The apparatus of claim 1, comprising a current source connected between said output node and said second power source.

3. An apparatus comprising:
 a differential amplifying unit configured to amplify and output an inputted differential voltage;
 a first mirroring unit configured to mirror a current flowing through a first output terminal of said differential amplifying unit, said first mirroring unit configured to output a mirrored first mirror current;
 a second mirroring unit configured to mirror a current flowing through a second output terminal of said differential amplifying unit, said second mirroring unit configured to output a mirrored second mirror current;
 a pull-up transistor connected between a first power source and an output node, said pull-up transistor configured to switch based on said first and second mirror currents; and
 a pull-down transistor connected between a second power source and said output node, said pull-down transistor configured to switch based on said first and second mirror currents, wherein said first mirroring unit comprises:
 a first current mirror connected between said first power source and said first output terminal and between said first power source and a gate of said pull-up transistor to mirror a current flowing between said first power source and said first output terminal, said first current mirror configured to provide said mirrored current to the gate of said pull-up transistor; and
 a second current mirror connected between said first power source and said first output terminal and between said first power source and a gate of said pull-down transistor to mirror said current flowing between said first power source and said first output terminal, said second current mirror configured to provide said mirrored current to the gate of said pull-down transistor.

4. An apparatus comprising:
a differential amplifying unit configured to amplify and output an inputted differential voltage;
a first mirroring unit configured to mirror a current flowing through a first output terminal of said differential amplifying unit, said first mirroring unit configured to output a mirrored first mirror current;
a second mirroring unit configured to mirror a current flowing through a second output terminal of said differential amplifying unit, said second mirroring unit configured to output a mirrored second mirror current;
a pull-up transistor connected between a first power source and an output node, said pull-up transistor configured to switch based on said first and second mirror currents; and
a pull-down transistor connected between a second power source and said output node, said pull-down transistor configured to switch based on said first and second mirror currents, wherein said second mirroring unit comprises:
a third current mirror connected between said first power source and said second output terminal and between said second power source and a gate of said pull-up transistor to mirror a current flowing between said first power source and said second output terminal, said second current mirror configured to provide said mirrored current to the gate of said pull-up transistor; and
a fourth current mirror connected between said first power source and said second output terminal and between said second power source and a gate of said pull-down transistor to mirror said current flowing between said first power source and said second output terminal, said fourth current mirror providing said mirrored current to the gate of said pull-down transistor.

5. The apparatus of claim 1, wherein said second mirroring unit comprises:
a $4^{th}$ transistor connected between said first power source and said second output terminal including a drain and a gate connected to each other;
a $5^{th}$ transistor having one end connected to said first power source, said $5^{th}$ transistor including a gate connected to the gate of said $4^{th}$ transistor;
a $6^{th}$ transistor connected between another end of said $5^{th}$ transistor and said second power source including a drain and a gate connected to each other;
a $7^{th}$ transistor connected between a gate of said pull-down transistor and said second power source, said $7^{th}$ transistor including a gate connected to the gate of said $6^{th}$ transistor; and
an $8^{th}$ transistor connected between a gate of said pull-up transistor and said second power source, said $8^{th}$ transistor including a gate connected to the gate of said $6^{th}$ transistor.

6. The apparatus of claim 5, wherein each of said $1^{st}$ to $3^{rd}$ transistors comprises an NMOS transistor.

7. The apparatus of claim 5, wherein each of said $4^{th}$ and $5^{th}$ transistors comprises an NMOS transistor and each of said $6^{th}$ to $8^{th}$ transistors comprises a PMOS transistor.

8. The apparatus of claim 7, wherein said pull-up transistor comprises an NMOS transistor and said pull-down transistor comprises a PMOS transistor.

9. The apparatus of claim 1, comprising a resistor and a capacitor connected in series between a gate of said pull-up transistor and said output node.

* * * * *